(12) United States Patent
Urban et al.

(10) Patent No.: US 11,787,687 B2
(45) Date of Patent: Oct. 17, 2023

(54) METHOD FOR MANUFACTURING A MICROMECHANICAL STRUCTURE AND MICROMECHANICAL STRUCTURE

(71) Applicant: Robert Bosch GmbH, Stuttgart (DE)

(72) Inventors: Andrea Urban, Stuttgart (DE); Jochen Reinmuth, Reutlingen (DE); Luise Fuchs, Dusslingen (DE); Thomas Friedrich, Moessingen-Oeschingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 95 days.

(21) Appl. No.: 17/233,398

(22) Filed: Apr. 16, 2021

(65) Prior Publication Data
US 2021/0331916 A1 Oct. 28, 2021

(30) Foreign Application Priority Data
Apr. 23, 2020 (DE) .......................... 102020205170.4

(51) Int. Cl.
*B81C 1/00* (2006.01)
*B81B 3/00* (2006.01)

(52) U.S. Cl.
CPC ........ *B81C 1/00063* (2013.01); *B81B 3/0018* (2013.01); *B81C 1/00015* (2013.01); *B81B 2201/0264* (2013.01)

(58) Field of Classification Search
CPC ............ B81C 1/00015; B81C 1/00063; B81C 2201/0112; B81C 1/00642; B81B 3/0018; B81B 2201/0264; B81B 2201/0235; B81B 2201/0242; B81B 2203/033; B81B 7/02
See application file for complete search history.

(56) References Cited

U.S. PATENT DOCUMENTS

| 6,140,207 A | 10/2000 | Lee |
| 2004/0147093 A1 | 7/2004 | Marty et al. |

(Continued)

FOREIGN PATENT DOCUMENTS

| DE | 102004005804 A1 | 9/2005 |
| DE | 102011080978 A1 | 2/2013 |

(Continued)

*Primary Examiner* — Shahed Ahmed
*Assistant Examiner* — Sun Mi Kim King
(74) *Attorney, Agent, or Firm* — NORTON ROSE FULBRIGHT US LLP; Gerard Messina

(57) ABSTRACT

A method for manufacturing a micromechanical structure and a micromechanical structure. The method includes: forming a first micromechanical functional layer; forming a plurality of trenches in the first micromechanical functional layer, which include an upper widened area at the upper side of the first micromechanical functional layer and a lower area of essentially constant width; depositing a sealing layer on the upper side of the first micromechanical functional layer to seal the plurality of trenches, a sealing point of the plurality of trenches being formed below the upper side of the first micromechanical functional layer and the first trenches being at least partially filled; thinning back the sealing layer by a predefined thickness; and forming a second micromechanical functional layer above the thinned-back sealing layer.

13 Claims, 14 Drawing Sheets

(56) References Cited

U.S. PATENT DOCUMENTS

| | | | | |
|---|---|---|---|---|
| 2013/0043548 A1* | 2/2013 | Reinmuth | ............ | B81C 1/00626 |
| | | | | 257/417 |
| 2014/0252358 A1* | 9/2014 | Chu | ................. | B81B 3/0059 |
| | | | | 257/51 |
| 2019/0161346 A1* | 5/2019 | Lee | ...................... | B81B 7/02 |
| 2020/0131027 A1* | 4/2020 | Kang | ................ | B81B 7/007 |

FOREIGN PATENT DOCUMENTS

| | | |
|---|---|---|
| DE | 102018222377 A1 | 6/2020 |
| DE | 102019201236 A1 | 8/2020 |

\* cited by examiner

METHOD FOR MANUFACTURING A MICROMECHANICAL STRUCTURE AND MICROMECHANICAL STRUCTURE

CROSS REFERENCE

The present application claims the benefit under 35 U.S.C. § 119 of German Patent Application No. DE 102020205170.4 filed on Apr. 23, 2020, which is expressly incorporated herein by reference in its entirety.

FIELD

The present invention relates to a method for manufacturing a micromechanical structure and a micromechanical structure.

BACKGROUND INFORMATION

Although any micromechanical components are usable, the present invention and its underlying problem are explained on the basis of acceleration and rotation rate sensors.

German Patent Application No. DE 10 2011 080 978 A1 describes a method using which a MEMS functional layer may be structured free of topography. This conventional method is typically used to situate multiple MEMS functional layers one over another. In a first MEMS functional layer made of silicon, first narrow, vertical trenches are etched. These first trenches are subsequently filled using an oxide by a first oxide deposition. In a further step, narrow second trenches are etched in the first oxide layer and the silicon of the first MEMS functional layer is etched out between each two first trenches using an isotropic etching step. The narrow second trenches are closed in the first oxide layer using a second oxide deposition. A second MEMS functional layer made of silicon is deposited on the now planar second oxide layer. The two oxide layers between the two MEMS functional layers are typically removed using a sacrificial layer etching method. In this method, the two functional layers may be structured independently of one another. Furthermore, the layer thickness of the first MEMS functional layer may also be selected independently of the thickness of the second MEMS functional layer.

However, the gap distance between the first and the second MEMS functional layer is determined by two oxide depositions. Both oxide depositions have to be selected to be at least sufficiently thick that the first and second trenches are filled.

The thickness of the first oxide deposition is therefore coupled to the width of the first trenches which have to be filled using the first oxide deposition. The minimum width of the first trenches is technically conditioned by the minimum representable trench width in the first MEMS functional layer. For thin MEMS functional layers, the minimum width is conditioned by the minimum resolution of the lithography process. For thick MEMS functional layers, the minimum width is conditioned by the trench process, which is conditioned by a maximum ratio of trench height to trench width.

The thickness of the second oxide deposition is not coupled to the thickness of the first MEMS functional layer, but via the thickness of the first oxide layer to the opening width of the narrow second trenches in the first oxide layer and may therefore be selected to be relatively small in the case of thin first oxide layers.

For some applications, the first trenches are used as a function gap in order to thus manufacture either capacitive detection structures or capacitive drive structures of acceleration or rotation rate sensors. It is therefore often desirable to not render the first trenches necessarily in minimum width, but to render these first trenches somewhat wider and also with variable width for some applications (for example contour trench).

SUMMARY

The present invention creates a method for manufacturing a micromechanical structure and a micromechanical structure.

Preferred refinements of the present invention are disclosed herein.

In accordance with an example embodiment of the present invention, trenches in a first MEMS functional layer are filled reliably using a vertically thin sealing layer, which is suitable in particular for layer depositions which have a restricted conformity.

In accordance with an example embodiment of the present invention, a special trench geometry is used which includes an opening cup in the upper area of the trenches. More sealing material, for example oxide, is initially required in this upper area to achieve a seal. However, the sealing point at which the sealing material grows together is located deeper and by way of a suitable geometry, the sealing point within the cup may be located below the upper side of the MEMS functional layer. This is used to thin back the sealing material after the layer deposition, for example, via a CMP process. Since the sealing point is below the upper side, the trenches remain reliably sealed and in the ideal case the oxide thickness may be reduced nearly to zero.

Therefore, broader trenches may be filled using sealing material. The gap distances between two MEMS functional layers may be made smaller. Sealing material deposition methods having less conformity or having varying conformity may be used for the seal. The seals of the trenches may be made robust, and trenches of differing width may be reliably filled.

According to one preferred refinement of the present invention, during the formation of the plurality of trenches, a mask layer is formed on the upper side of the first micromechanical functional layer, which includes mask openings corresponding to the plurality of first trenches to be formed, a width of the mask openings corresponding to the essentially constant width of the plurality of trenches to be formed in the lower area, an isotropic etching process is carried out to form the upper widened area on the upper side of the first micromechanical functional layer, the mask openings being undercut, an anisotropic etching process is carried out to form the lower area of essentially constant width, and the mask layer is removed. The trenches may thus be formed having the desired geometry.

According to a further preferred refinement of the present invention, a polish stop layer is formed on the upper side of the first micromechanical functional layer, which includes openings corresponding to the plurality of trenches to be formed, a width of the openings corresponding to a width of the plurality of trenches to be formed on the upper side in the upper area, and the mask layer is formed on the polish stop layer, the mask openings being offset accordingly in relation to the openings. This later enables a precisely defined removal of the sealing layer.

According to a further preferred refinement of the present invention, during the formation of the plurality of trenches, a polish stop layer is formed on the upper side of the first micromechanical functional layer, which includes openings corresponding to the plurality of trenches to be formed, a width of the openings corresponding to a width of the plurality of trenches to be formed on the upper side in the upper area, a mask layer is formed on the polish stop layer which includes mask openings corresponding to the plurality of trenches to be formed, a width of the mask openings corresponding to the essentially constant width of the plurality of trenches to be formed in the lower area and the mask openings being offset accordingly in relation to the openings, an anisotropic etching process is carried out to form the lower area having the essentially constant width, the mask layer is removed, an isotropic etching process is carried out to form the upper widened area on the upper side of the first micromechanical functional layer, the polish stop layer being used as a mask. The trenches may thus be formed having the desired geometry in an alternative method.

According to a further preferred refinement of the present invention, the sealing layer is deposited on the polish stop layer, the thinning back of the sealing layer by the predefined thickness being carried out up to the polish stop layer. This also later enables an accurately defined removal of the sealing layer in the alternative method for trench formation.

According to a further preferred refinement of the present invention, the polish stop layer is removed after the thinning back, the thinned-back sealing layer is thinned back further to the upper side and, before the formation of the second micromechanical functional layer on the further thinned-back sealing layer, an intermediate layer is deposited on the upper side and the further thinned-back sealing layer. With the aid of the intermediate layer, the distance between the first and second micromechanical functional layer may be set independently of the sealing layer.

According to a further preferred refinement of the present invention, as further steps, a first insulation layer is formed above a substrate, the first micromechanical functional layer is formed on the first insulation layer, first etch accesses are formed in the thinned-back sealing layer, which expose areas of the first micromechanical functional layer; the first micromechanical functional layer is etched through the etching accesses, the trenches and the first insulation layer acting as an etch stop, and a second insulation layer is formed on the thinned-back sealing layer after the etching, the etching accesses being sealed. The first micromechanical functional layer may thus be structured after the sealing of the trenches by the sealing layer.

According to a further preferred refinement of the present invention, as further steps, a first insulation layer is formed above a substrate, the first micromechanical functional layer is formed on the first insulation layer, first etching accesses are formed in the intermediate layer, which expose areas of the first micromechanical functional layer, the first micromechanical functional layer is etched through the etching accesses, the trenches and the first insulation layer acting as an etch stop, and a second insulation layer is formed on the intermediate layer after the etching, the etching accesses being sealed. The first micromechanical functional layer may thus be structured after the sealing of the trenches by the sealing layer if an intermediate layer is used.

According to a further preferred refinement of the present invention, as further steps, the second micromechanical functional layer is formed above the second insulation layer, second etching accesses are formed in the second micromechanical functional layer, which expose areas of the second insulation layer, and the first and second insulation layer and thinned-back sealing layer are selectively etched in relation to the first and second micromechanical functional layer, the first insulation layer is removed except for remaining areas which anchor the first micromechanical functional layer on the substrate. The sealing layer may thus be used as a sacrificial layer.

According to a further preferred refinement of the present invention, as further steps, the second micromechanical functional layer is formed above the second insulation layer, second etching accesses are formed in the second micromechanical functional layer, which expose areas of the second insulation layer, the first and second insulation layer, the thinned-back sealing layer, and the intermediate layer are selectively etched in relation to the first and second micromechanical functional layer, the first insulation layer being removed except for remaining areas which anchor the first micromechanical functional layer on the substrate. The sealing layer may thus additionally be used as a sacrificial layer.

According to a further preferred refinement of the present invention, the first trenches include rounded edges and/or intersections having local constrictions. This also enables a constant trench width also at edges and intersections.

According to a further preferred refinement of the present invention, the sealing layer and/or the intermediate layer is/are selected from the group: oxide layer, silicon nitride layer, silicon oxynitride layer, silicon layer, aluminum layer, germanium layer, titanium layer, tungsten layer, copper layer, or a combination of the preceding layers.

BRIEF DESCRIPTION OF THE DRAWINGS

Further features and advantages of the present invention are explained hereinafter on the basis of specific embodiments of the present invention with reference to the figures.

DETAILED DESCRIPTION OF EXAMPLE EMBODIMENTS

Figure 1A:
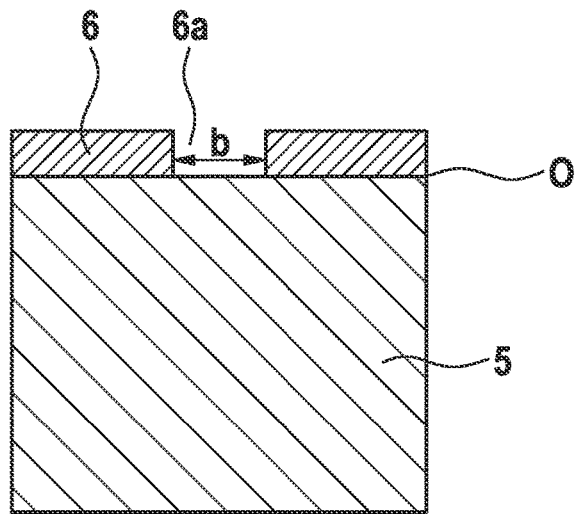
FIGS. 1A) through 1G) show schematic cross-sectional views to explain a micromechanical structure and a corresponding manufacturing method according to a first specific embodiment of the present invention.

In the figures, identical reference numerals identify identical or functionally-identical elements.

FIGS. 1A) through 1G) show schematic cross-sectional views to explain a micromechanical structure and a corresponding manufacturing method according to a first specific embodiment of the present invention.

In FIG. 1A), reference numeral 5 identifies a micromechanical functional layer, for example, a polysilicon layer, which is applied, for example, to a substrate (not shown).

Initially a plurality of trenches 7 is to be formed in micromechanical functional layer 5, which include an upper cup-like widened area 7a at upper side O of first micromechanical functional layer 5 and a lower area 7b of essentially constant width, as explained hereinafter. To simplify the illustration, only one of trenches 7 of the plurality of trenches 7 is shown in each case hereinafter.

Furthermore with reference to FIG. 1A), initially a mask layer 6, for example a photoresist mask, is formed on the upper side of first micromechanical functional layer 5, which includes mask openings 6a corresponding to the plurality of first trenches 7 to be formed. A width b of mask openings 6a corresponds to the essentially constant width of the plurality of trenches 7 to be formed in lower area 7b.

Figure 1B:
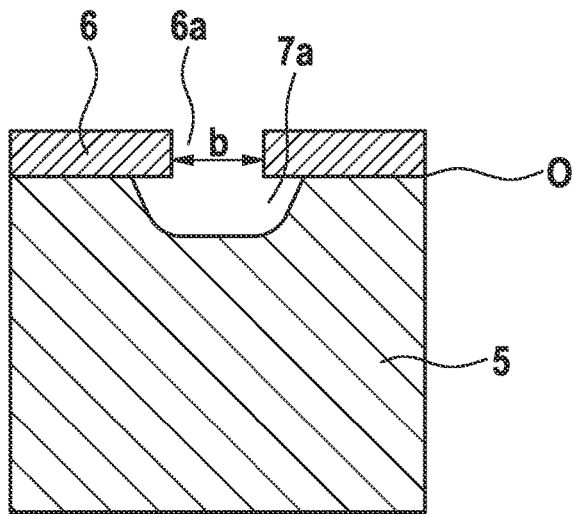

With reference to FIG. 1B), initially an isotropic etching process is carried out to form upper widened area 7a at upper side O of first micromechanical functional layer 5, mask openings 6a being undercut.

Figure 1C:
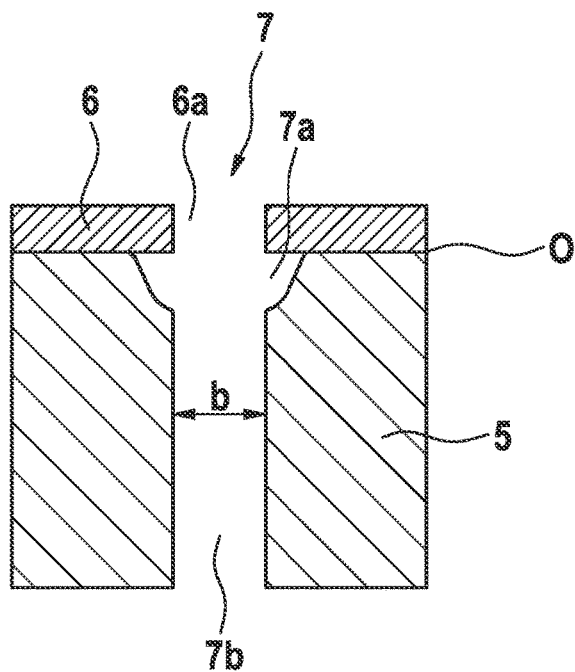

Subsequently thereto, according to FIG. 1C), an isotropic etching process is carried out to form lower area 7b of essentially constant width. Thereafter, mask layer 6 is removed again.

Typically, width b is widened in cup-shaped upper area 7a by at least 10% toward upper side O.

The etching process for trenches 7 is preferably a cyclic etching process, which is made up of at least two repeating steps. In a first step, predominantly isotropic silicon is etched and a passivation layer on the base of trenches 7 is opened by an anisotropic etching component.

In a second step, a passivation is deposited predominantly isotropically on the entire surface of trenches 7. To generate cup-shaped upper area 7a, for example, it is advantageous to start the cyclic trench etching process with an isotropic silicon etching process and to etch 50% more silicon at least in the first cycle than the average of all silicon etching cycles. In particular, the first and possibly some further silicon etching cycles are carried out in such a way that the upper area is widened by at least the said 10% in relation to width b.

Subsequently, with reference to FIG. 1D), a sealing layer 8 is deposited, for example an oxide layer, on upper side O of first micromechanical functional layer 5 to seal the plurality of trenches. Typically, at least 50% of width b is deposited as the thickness of sealing layer 8. The deposition method is a non-conformal deposition method, whereby typically empty spaces V form in the interior of sealed trenches 7. Trenches 7 are filled up enough that their walls are covered by sealing layer 8 and a sealing point P of the plurality of trenches 7 is located below upper side O of first micromechanical functional layer 5, which is significant for the following process steps.

The effective minimum opening angle of upper area 7a is typically greater than the arctangent of 1−(conformity of the deposition process), the conformity being the ratio of the deposition rate on horizontal upper side O to the deposition rate on the vertical walls of trenches 7.

Figure 1D:
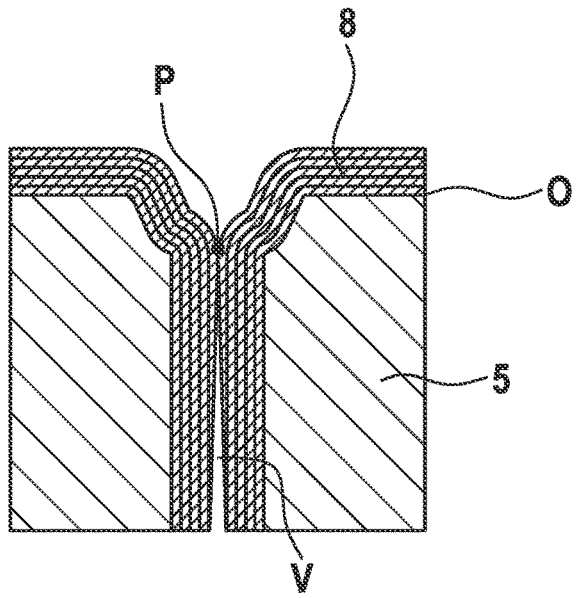
Figure 1E:
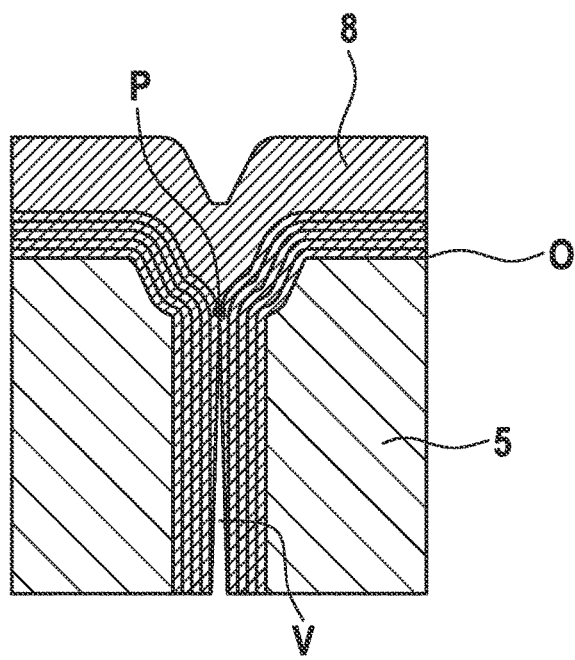

According to FIG. 1E), the deposition is continued enough that sealing layer 8 extends beyond upper side O.

Figure 1F:
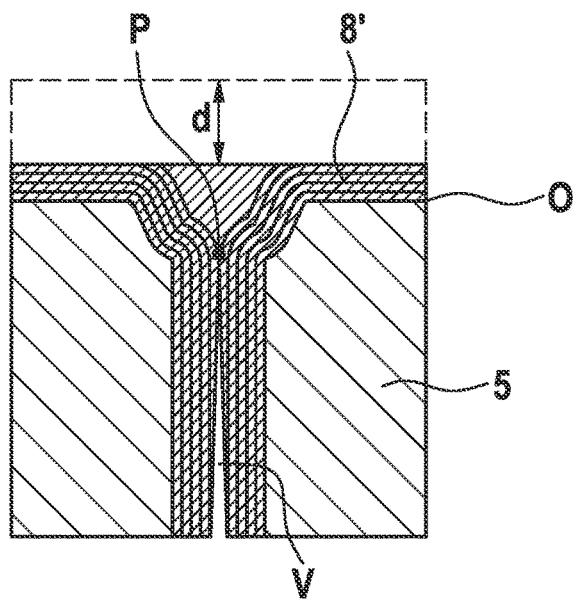

Furthermore, with reference to FIG. 1F), sealing layer 8 is thinned back by a predefined thickness d, for which a CMP process (chemical-mechanical polishing) is preferably used. A CMP process including end point recognition is preferably used in order to achieve a defined residual thickness or a defined thickness removal d, which results in the process state shown in FIG. 1F).

Figure 1G:
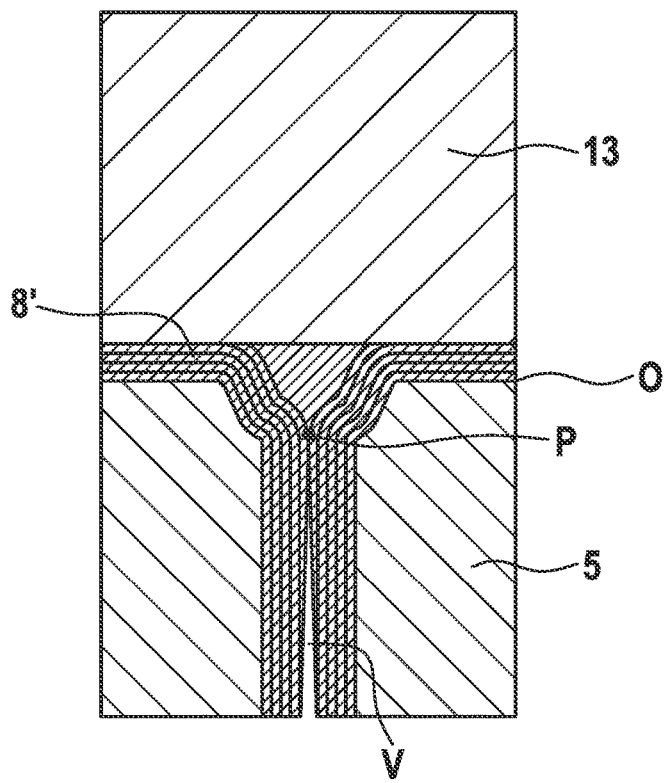

In a further process step, which is shown in FIG. 1G), a second micromechanical functional layer 13, for example also a polysilicon layer, is deposited on thinned-back sealing layer 8'.

A stack of first micromechanical functional layer 5 and second micromechanical functional layer 13 including thinned-back sealing layer 8' located therebetween may be generated without topography by the process step sequence according to FIGS. 1A) through 1G), which enables a very small gap distance between the two micromechanical functional layers 5, 13.

In further process steps (not shown), second micromechanical functional layer 13 may then be structured and sealing layer 8' may be partially or entirely removed in a sacrificial layer etching method.

Figure 2A:
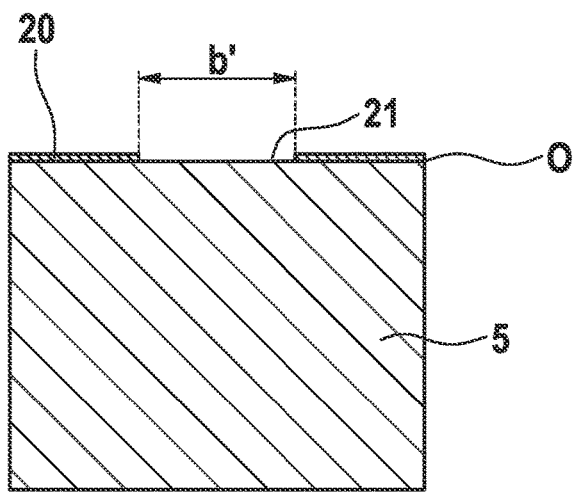
FIGS. 2A) through 2H) show schematic cross-sectional views to explain a micromechanical structure and a corresponding manufacturing method according to a second specific embodiment of the present invention FIGS. 3A) through 3C) show schematic cross-sectional views to explain a micromechanical structure and a corresponding manufacturing method according to a third specific embodiment of the present invention.

FIGS. 2A) through 2H) are schematic cross-sectional views to explain a micromechanical structure and a corresponding manufacturing method according to a second specific embodiment of the present invention.

With reference to FIG. 2A), initially a polish stop layer 20 is formed on upper side O of first micromechanical functional layer 5, polish stop layer 20 including openings 21 corresponding to the plurality of trenches 7 to be formed, whose width b' corresponds to a width of the plurality of trenches 7 to be formed at the upper side in upper widened area 7a.

A silicon nitride layer is particularly advantageous as polish stop layer 20. It is particularly well suitable for an oxide CMP process due to the high selectivity and may also be removed very selectively in relation to the oxide layer as sealing layer 7, for example using phosphoric acid.

Figure 2B:
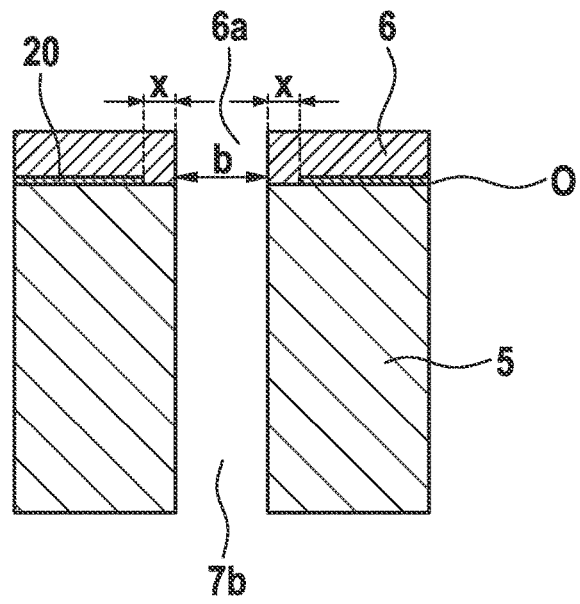

Furthermore, with reference to FIG. 2B), mask layer 6 is formed on polish stop layer 20, mask layer 6 including mask openings corresponding to the plurality of trenches 7 to be formed, whose width b corresponds to the essentially constant width of the plurality of trenches 7 to be formed in the lower area. Mask openings 6a are offset accordingly in relation to openings 21, in particular on both sides by a distance x, the relationship 2x+b=b' applying.

Figure 2C:
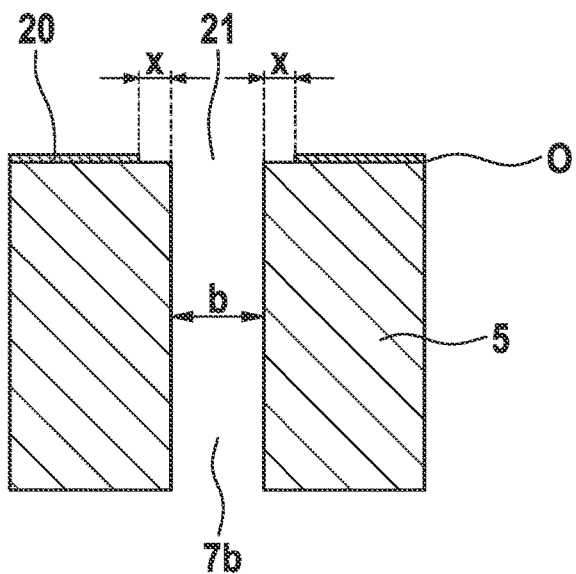
Figure 2D:
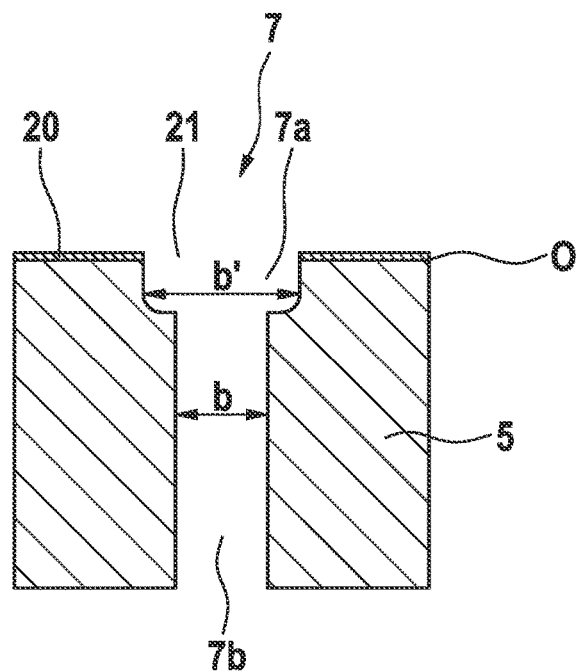

Following the process state shown in FIG. 2B), initially an anisotropic etching process is carried out to form lower area 7b including the essentially constant width. Thereafter, mask layer 6 is removed as shown in FIG. 2C). Then, with reference to FIG. 2D), an isotropic etching process is carried out to form upper widened area 7a at upper side O of first micromechanical functional layer 5, polish stop layer 20 being used as a mask.

Figure 2E:
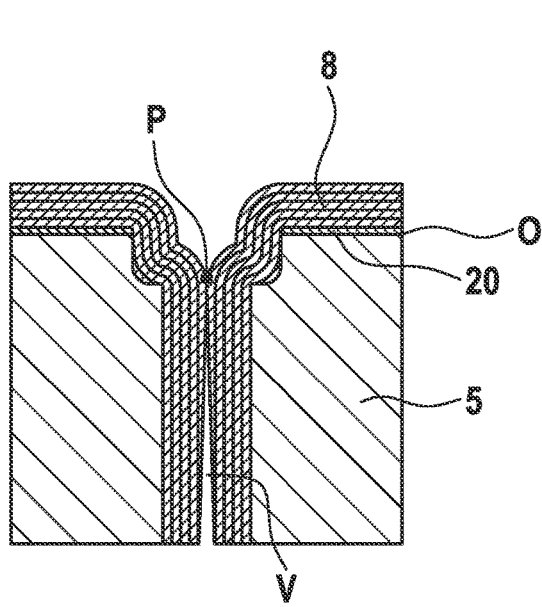
Figure 2F:
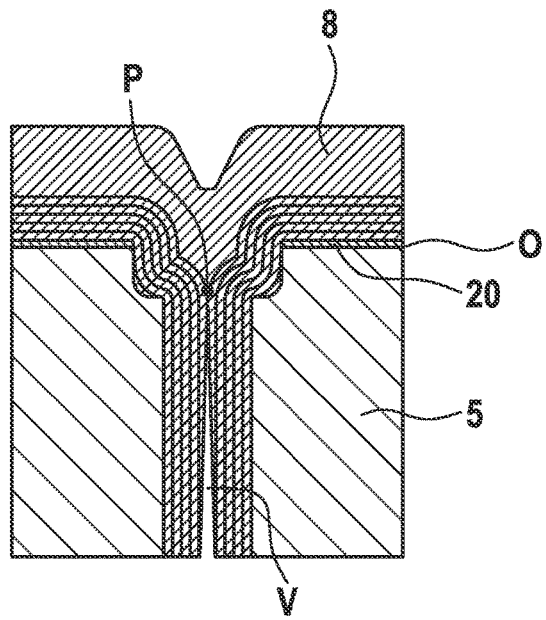

As shown in FIG. 2E), sealing layer 8 is then deposited with the aid of the nonconformal deposition process on polish stop layer 20. As in the first specific embodiment, the deposition process is continued until sealing layer 8 extends beyond upper side O of first micromechanical functional layer 5, sealing point P being located below upper side O, as shown in FIG. 2F).

Figure 2G:
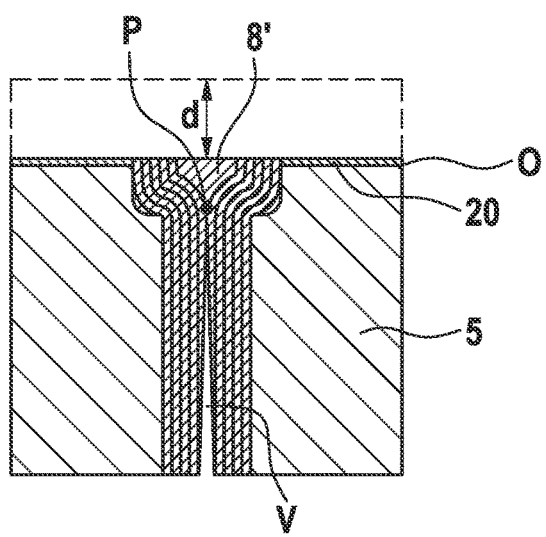

Furthermore, with reference to FIG. 2G), sealing layer 8 is thinned back, for example, by the CMP process and predefined thickness d' to polish stop layer 20.

Figure 2H:
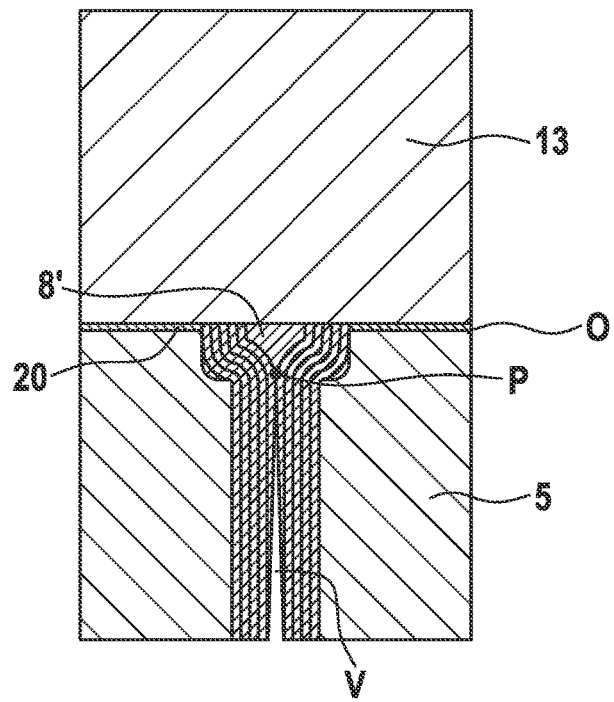

Subsequently, with reference to FIG. 2H), second micromechanical functional layer 13 is deposited, for example a polysilicon layer, and possible further process steps are carried out as mentioned in conjunction with the first specific embodiment.

The use of polish stop layer 20 including openings 21 is moreover also possible in a variant of the first specific embodiment.

Figure 3A:
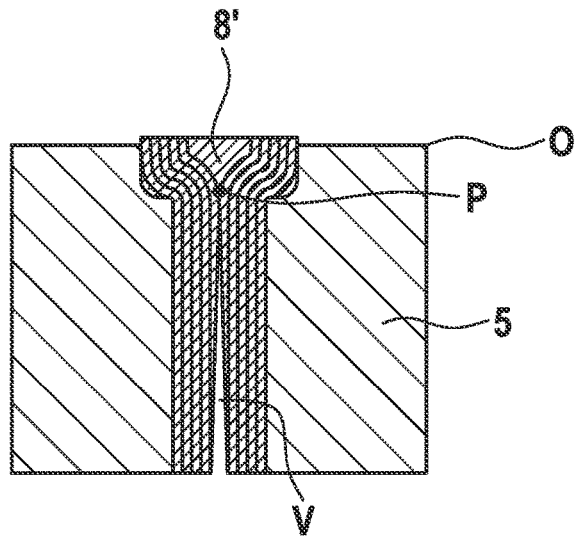

FIGS. 3A) through 3C) are schematic cross-sectional views to explain a micromechanical structure and a corresponding manufacturing method according to a third specific embodiment of the present invention.

The third specific embodiment is a variant of the second specific embodiment, after the process state shown in FIG. 2G), polish stop layer 20 being removed after the thinning back, as shown in FIG. 3A), for example selectively with the aid of phosphoric acid.

Figure 3B:
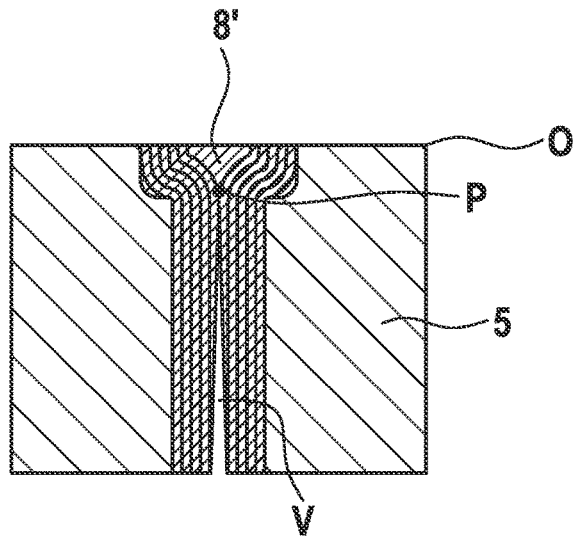

Furthermore, with reference to FIG. 3B), thinned-back sealing layer 8' is thinned back further up to upper side O, so that further thinned-back sealing layer 8' now extends flush with upper side O of first micromechanical functional layer 5.

Subsequently, with reference to FIG. 3C), an intermediate layer 8" is deposited on upper side O and further thinned-back sealing layer 8', whose thickness is settable arbitrarily low. Intermediate layer 8" is, for example, also an oxide layer.

Figure 3C:
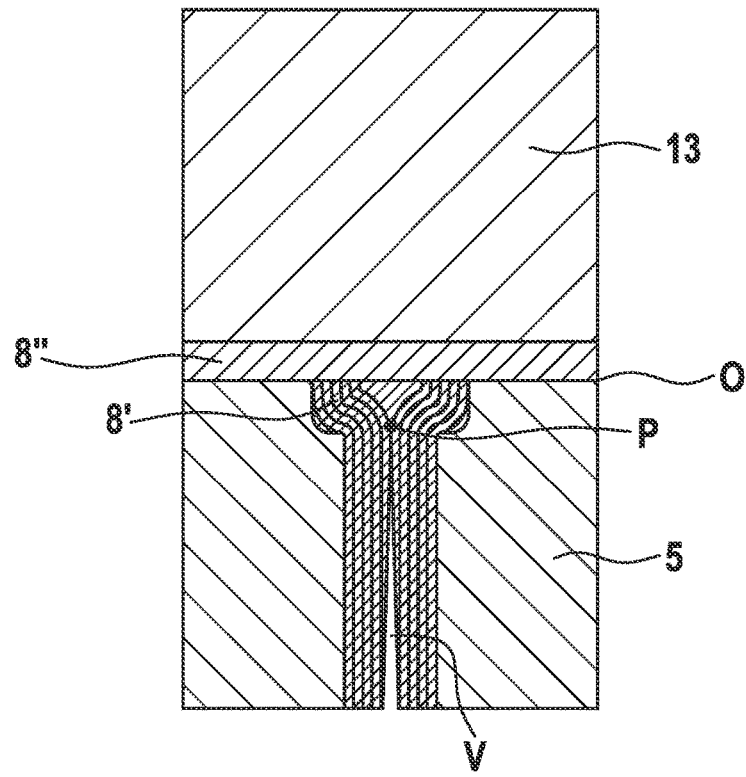

Finally, according to FIG. 3C), second micromechanical functional layer 13 is deposited on the intermediate layer. Further process steps, as mentioned above, may follow the process state shown in FIG. 3C).

Figure 4A:
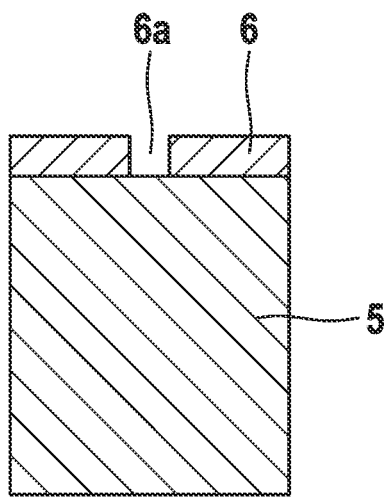
FIGS. 4A) through 4E) show schematic views to explain preferred trench forms in the specific embodiments of the present invention, FIG. 4A) showing a cross-sectional view and FIGS. 4B) through 4E) showing top views.
Figure 4B:
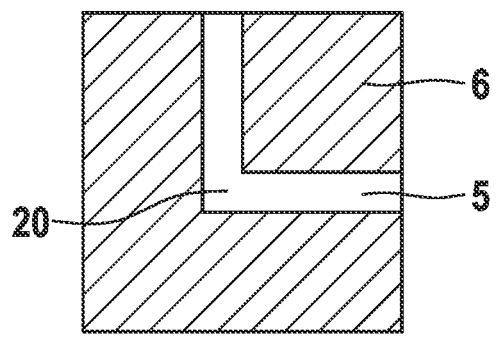

FIGS. 4A) through 4E) are schematic views to explain preferred trench forms in the specific embodiments of the present invention, FIG. 4A) being a cross-sectional view and FIGS. 4B) through E) being top views.

Figure 4C:
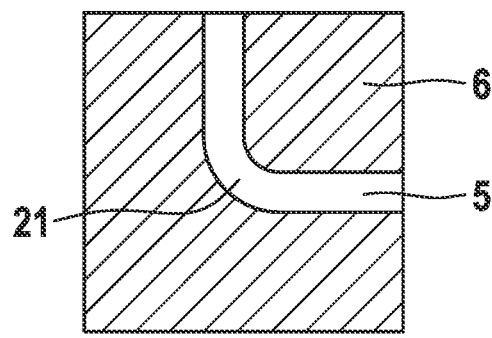

FIG. 4A) corresponds to the illustration according to FIG. 1A). In FIG. 4B), an upper top view of mask layer 6 is shown, trenches 7 including right-angled corners 20. However, it is preferred for the provided method according to FIG. 4C) that corners 20 include roundings 21, so that a constant trench width is present.

Figure 4D:
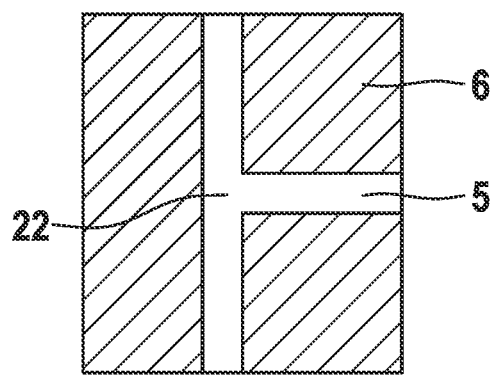
Figure 4E:
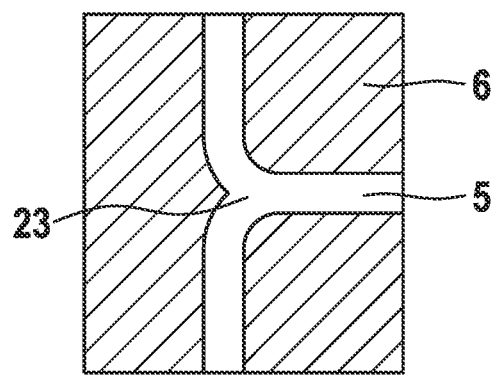

FIG. 4D) accordingly shows that trenches 7 include right-angle branches 22. However, it is preferred for the provided method according to FIG. 4E) that branches 22 include local constrictions 23, so that the trench width also always remains constant.

Figure 5A:
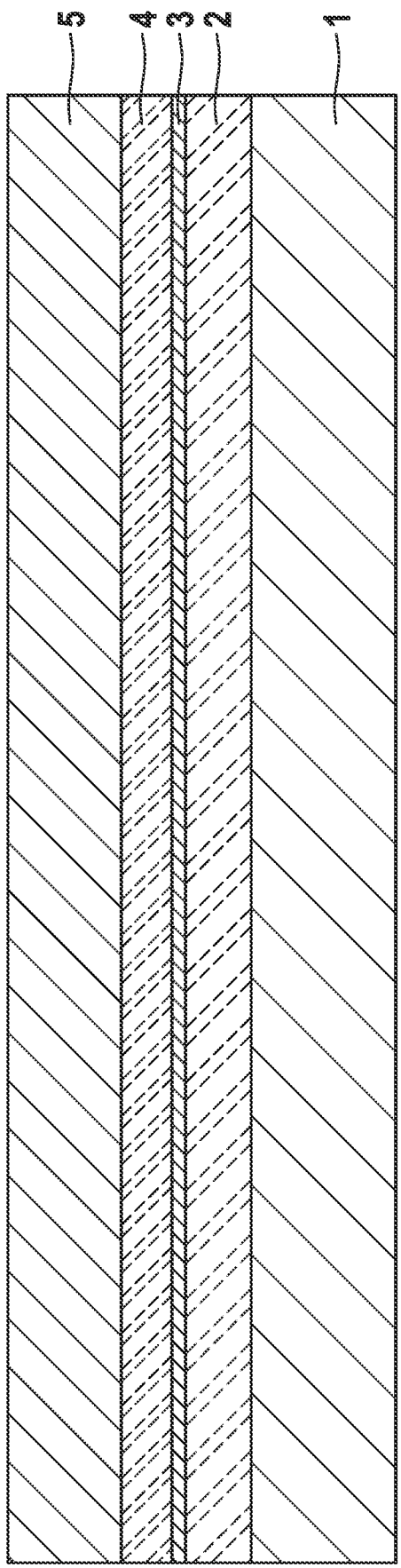
FIGS. 5A) through 5H) show schematic cross-sectional views to explain a micromechanical structure and a corresponding manufacturing method according to a fourth specific embodiment of the present invention.

FIGS. 5A) through 5H) are schematic cross-sectional views to explain a micromechanical structure and a corresponding manufacturing method according to a fourth specific embodiment of the present invention.

With reference to FIG. 5A), a base insulation layer 2 is deposited above a silicon substrate 1. This base insulation layer 2 may optionally be structured, for example, to connect the next functional plane lying above it to substrate 1. Optionally, one or multiple functional layers 3, for example made up of polysilicon, may then be deposited and structured. In the further course of the process, a first insulation layer 4 is deposited on this or these functional layers 3. This first insulation layer 4 is used in the further process as a sacrificial layer or insulation layer or anchoring layer. Of course, first insulation layer 4 may optionally also be structured to establish an electrical and/or mechanical contact to the next functional layer lying above it.

In the further course of the process, first micromechanical functional layer 5 is deposited on first insulation layer 4. This may be carried out, for example, in an LPCVD method or in a combined method including an LPCVD starting layer and an epitaxial layer made of polysilicon lying above it. First micromechanical functional layer 5 made of polysilicon may then optionally be planarized using a polishing method (CMP=chemical-mechanical polishing). Depending on the substructure or thickness of first micromechanical functional layer 5, this may be necessary to obtain a sufficiently good lithographic resolution in the subsequent step.

Figure 5B:
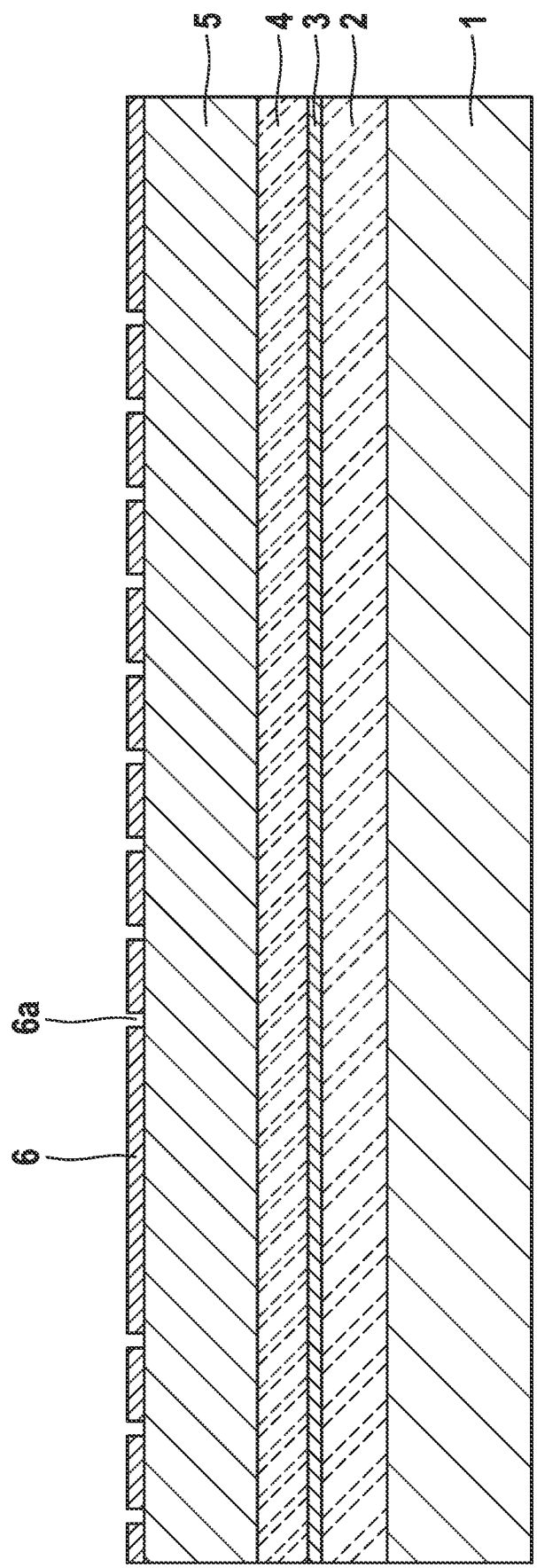

Furthermore, with reference to FIG. 5B), mask layer 6 is provided above first micromechanical functional layer 5, which includes openings 6a, with the aid of which in a following process step the underlying polysilicon of first micromechanical functional layer 5 is to be trenched, as already explained in conjunction with the first through third specific embodiments.

Polish stop layer 20 already described in conjunction with FIGS. 2A) through 2H) may optionally additionally be provided.

Figure 5C:
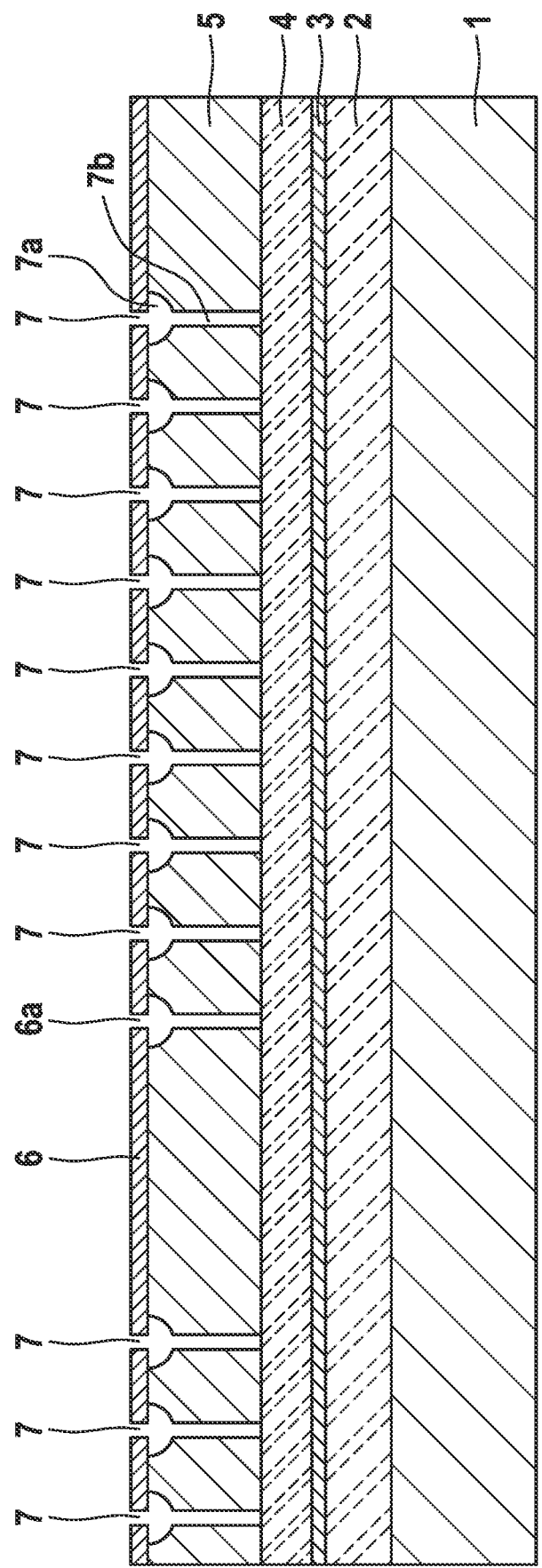

FIG. 5C) shows the process state after carrying out the trenching step, in which trenches 7 are formed in first micromechanical functional layer 5, which extend up to first insulation layer 4. This corresponds, for example, to the process state according to FIG. 10). If polish stop layer 20 is additionally provided, process steps according to FIGS. 2A) through 2D) may also be carried out, the polish stop layer taking the place of mask layer 6 in FIG. 5C).

Figure 5D:
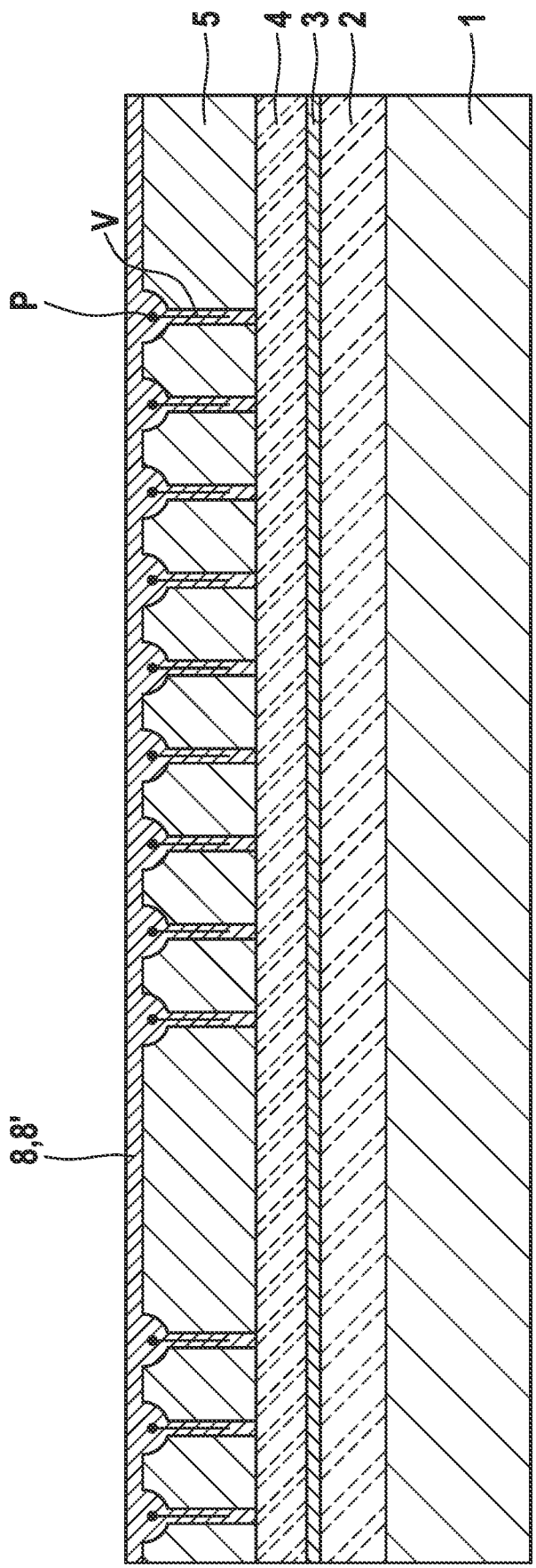

With reference to FIG. 5D), mask layer 6 is removed and then process steps according to FIGS. 1D) through 1F) take place. Alternatively, the process steps according to FIGS. 2E) through 2G) or, subsequently to FIG. 2G), process steps according to FIGS. 3A) through 3C) may be carried out to fill trenches 7 and form thinned-back sealing layer 8' or intermediate layer 8".

Figure 5E:
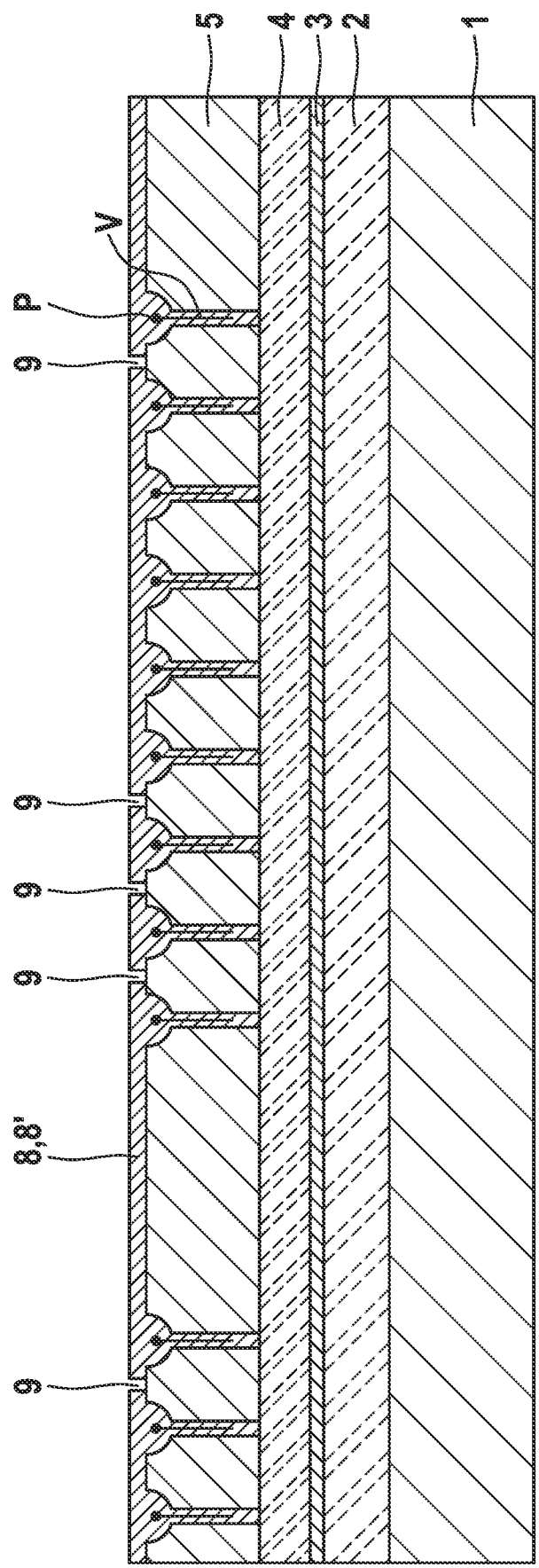

Etching accesses 9, which expose areas of first micromechanical functional layer 5, are then formed in sealing layer 8' or intermediate layer 8" according to FIG. 5E). The width of these first etching accesses 9 is selected in such a way that they may be completely sealed again by an oxide deposition taking place later and still to be described.

Figure 5F:
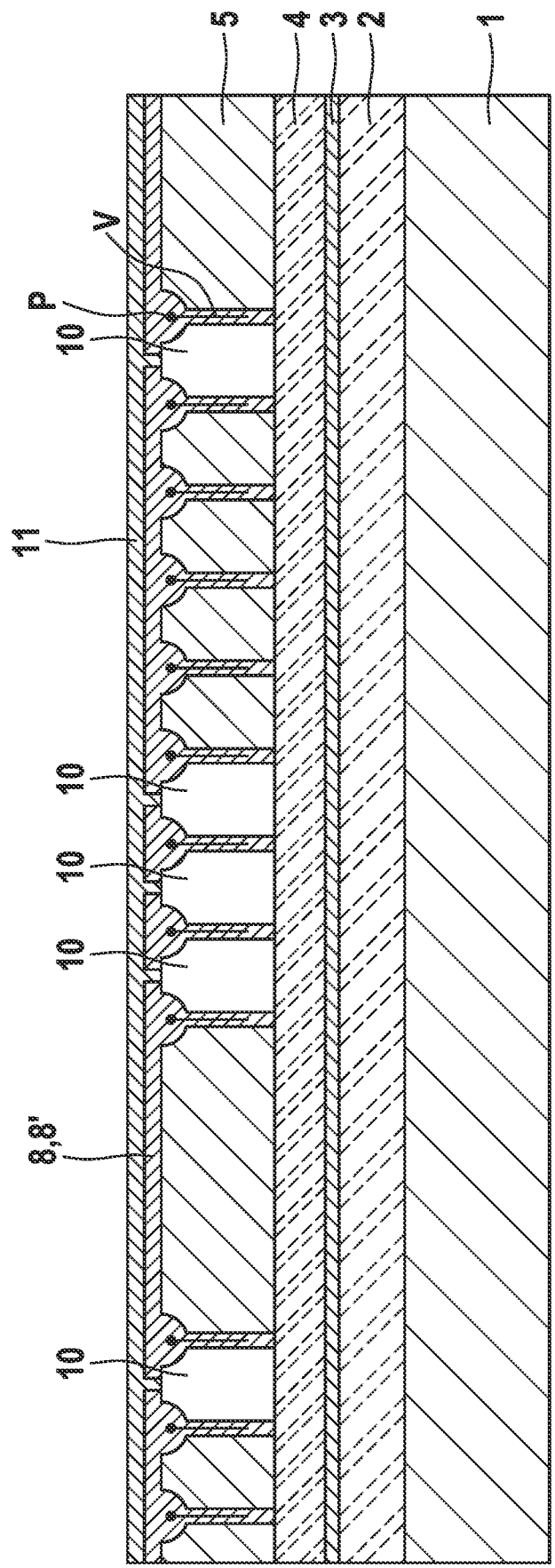

As shown in FIG. 5F), recesses 10 are etched into first micromechanical functional layer 5 in an etching step. Isotropic methods are preferably used for this purpose. The gas phase method has proven to be particularly favorable, since it may be difficult to flush out liquid etching media again from the undercut areas via narrow first etching accesses 9. One exemplary method is an etching process using $SF_6$ in a plasma or using $ClF_3$ or using $XeF_2$. In this etching of the first micromechanical functional layer, first trenches 7 filled with oxide and underlying first insulation layer 4 are used as the etch stop. In other segments, the etching of the polysilicon of first micromechanical functional layer 5 may be limited via the etching time. Second insulation layer 8 made of oxide deposited in narrow trenches 7 may also be used to stabilize this layer. In the case of such large areas, it is additionally favorable to form etching accesses 9 in second sealing layer 8' or intermediate layer 8" in such a way that stress in this layer may be dissipated by the geometrical arrangement of the etching accesses. For example, a meandering arrangement of etching accesses 9 may be used or long etching accesses 9 offset in relation to one another.

Furthermore, with reference to FIG. 5F), a further insulation layer 11 made of oxide is deposited to seal etching accesses 9 in sealing layer 8' or intermediate layer 8". Sealing layer 8' or intermediate layer 8" and further insulation layer 11 jointly form a further sacrificial and insulation layer. Due to the described manufacturing method, in particular no significant topography results at points at which first micromechanical functional layer 5 was etched.

Figure 5G:
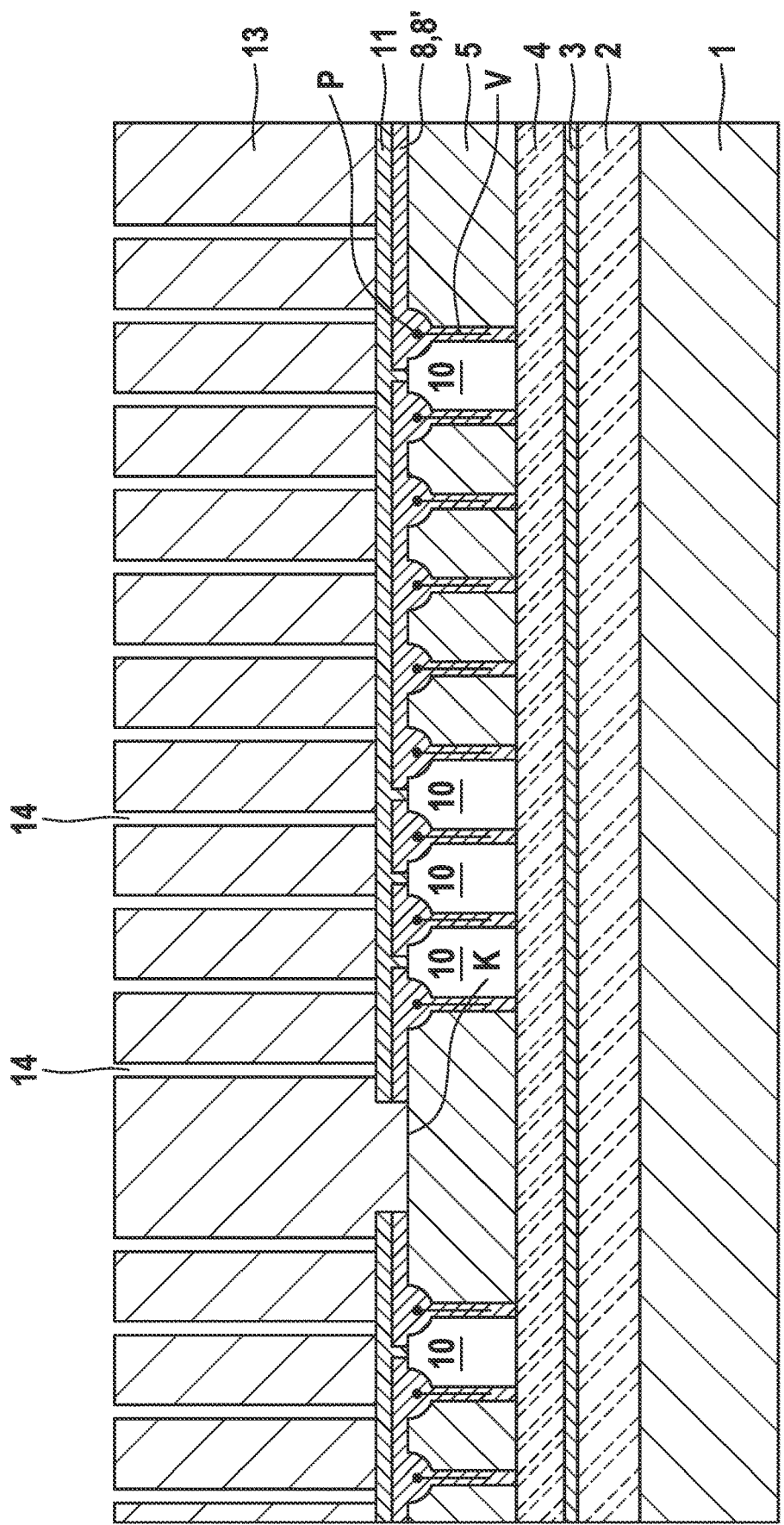

As shown in FIG. 5G), subsequently one or multiple contact areas K of first micromechanical functional layer 5 are exposed in that second sealing layer 8' or intermediate layer 8" and insulation layer 11 are removed at the affected locations by an etching process. Such contact areas K define connections to a subsequently deposited further micromechanical functional layer 13 made of polysilicon.

In a conventional way, second micromechanical functional layer 13 is then structured to form second etching accesses 14 in second micromechanical functional layer 13, which expose areas of insulation layer 11, as shown in FIG. 5G).

Figure 5H:
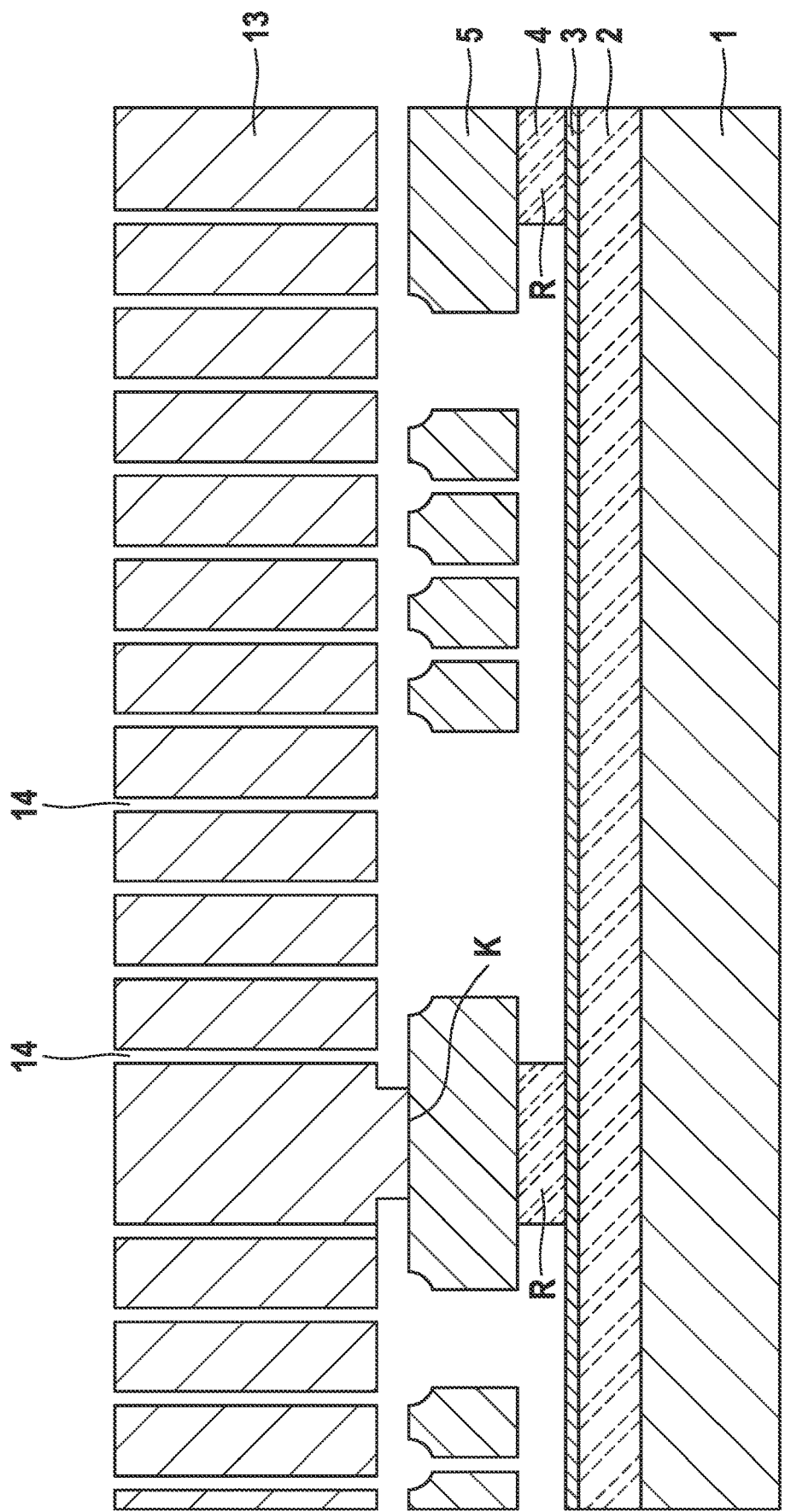

Finally, with reference to FIG. 5H), a further etching process is carried out to remove sealing layer 8' or intermediate layer 8" and insulation layer 11 completely and to remove first insulation layer 4 except for remaining areas R, at which first micromechanical functional layer 5 is anchored on substrate 1.

Although the present invention was described on the basis of preferred exemplary embodiments, it is not restricted thereto. In particular, the mentioned materials and topologies are only by way of example and are not restricted to the explained examples.

The areas of application are also broad and are not restricted to acceleration and rotation rate sensors, but are possible for arbitrary micromechanical sensors, in particular, for example, capacitive pressure sensors.

An oxide deposition to fill the trenches was always presumed above, but the described present invention is not restricted to an oxide deposition, it may be transferred to any deposition using which a trench may be sealed. There it also applies in particular for depositions of SiN (silicon nitride), SiRiN (silicon-rich nitride), SiON (silicon oxynitride), Si (silicon), Al (aluminum), Ge (germanium), Ti (titanium), W (tungsten), Cu (copper), etc.

What is claimed is:

1. A method for manufacturing a micromechanical structure, comprising the following steps:
    forming a first micromechanical functional layer;
    forming a plurality of trenches in the first micromechanical functional layer, which each include an upper widened area at an upper side of the first micromechanical functional layer and a lower area of constant width;
    depositing a sealing layer on the upper side of the first micromechanical functional layer to seal the plurality of trenches, a sealing point of each of the plurality of trenches being formed below the upper side of the first micromechanical functional layer, and each of the plurality of trenches being at least partially filled;
    thinning back the sealing layer by a predefined thickness; and
    forming a second micromechanical functional layer above the thinned-back sealing layer,
    wherein the forming of the plurality of trenches includes forming a mask layer at the upper side of the first micromechanical functional layer, the mask layer including mask openings corresponding to the plurality of first trenches to be formed, a width of the mask openings corresponding to the constant width of the plurality of trenches to be formed in the lower area.

2. A method for manufacturing a micromechanical structure, comprising the following steps:
    forming a first micromechanical functional layer;
    forming a plurality of trenches in the first micromechanical functional layer, which each include an upper widened area at an upper side of the first micromechanical functional layer and a lower area of constant width;
    depositing a sealing layer on the upper side of the first micromechanical functional layer to seal the plurality of trenches, a sealing point of each of the plurality of trenches being formed below the upper side of the first micromechanical functional layer, and each of the plurality of trenches being at least partially filled;
    thinning back the sealing layer by a predefined thickness; and
    forming a second micromechanical functional layer above the thinned-back sealing layer,
    wherein the forming of the plurality of trenches includes the following steps:
    forming a mask layer at the upper side of the first micromechanical functional layer, the mask layer including mask openings corresponding to the plurality of first trenches to be formed, a width of the mask openings corresponding to the constant width of the plurality of trenches to be formed in the lower area;
    carrying out an isotropic etching process to form each of the upper widened areas at the upper side of the first micromechanical functional layer, the mask openings being undercut;
    carrying out an anisotropic etching process to form each of the lower areas of constant width; and
    removing the mask layer.

3. The method as recited in claim 2, further comprising the following steps:
    forming a polish stop layer at the upper side of the first micromechanical functional layer, which includes openings corresponding to the plurality of trenches to be formed, a width of the openings corresponding to a width of the plurality of trenches to be formed at the upper side in the upper area; and
    forming the mask layer on the polish stop layer, the mask openings being offset in relation to the openings.

4. A method for manufacturing a micromechanical structure, comprising the following steps:
    forming a first micromechanical functional layer;
    forming a plurality of trenches in the first micromechanical functional layer, which each include an upper widened area at an upper side of the first micromechanical functional layer and a lower area of constant width;
    depositing a sealing layer on the upper side of the first micromechanical functional layer to seal the plurality of trenches, a sealing point of each of the plurality of trenches being formed below the upper side of the first micromechanical functional layer, and each of the plurality of trenches being at least partially filled;
    thinning back the sealing layer by a predefined thickness; and
    forming a second micromechanical functional layer above the thinned-back sealing layer,
    wherein the forming of the plurality of trenches includes the following steps:
    forming a polish stop layer at the upper side of the first micromechanical functional layer, which includes openings corresponding to the plurality of trenches to be formed, a width of the openings corresponding to a width of the plurality of trenches to be formed at the upper side in the upper area;
    forming a mask layer on the polish stop layer, the mask layer including mask openings corresponding to the plurality of trenches to be formed, a width of the mask openings corresponding to the constant width of the plurality of trenches to be formed in the lower area and the mask openings being offset in relation to the openings;
    carrying out an anisotropic etching process to form the lower areas of the constant width;
    removing the mask layer; and carrying out an isotropic etching process to form the upper widened areas at the upper side of the first micromechanical functional layer, the polish stop layer being used as a mask.

5. The method as recited in claim 4, wherein the sealing layer is deposited on the polish stop layer and the thinning back of the sealing layer is carried out by the predefined thickness up to the polish stop layer.

6. The method as recited in claim 5, wherein the polish stop layer is removed after the thinning back, the thinned-back sealing layer is thinned back further down up to the upper side, and before the formation of the second micromechanical functional layer on the further thinned-back sealing layer, an intermediate layer is deposited on the upper side and the further thinned-back sealing layer.

7. A method for manufacturing a micromechanical structure, comprising the following steps:
forming a first micromechanical functional layer;
forming a plurality of trenches in the first micromechanical functional layer, which each include an upper widened area at an upper side of the first micromechanical functional layer and a lower area of constant width;
depositing a sealing layer on the upper side of the first micromechanical functional layer to seal the plurality of trenches, a sealing point of each of the plurality of trenches being formed below the upper side of the first micromechanical functional layer, and each of the plurality of trenches being at least partially filled;
thinning back the sealing layer by a predefined thickness; and
forming a second micromechanical functional layer above the thinned-back sealing layer,
forming a first insulation layer above a substrate;
forming the first micromechanical functional layer on the first insulation layer;
forming first etching accesses in the thinned-back sealing layer, which expose areas of the first micromechanical functional layer;
etching the first micromechanical functional layer through the etching accesses, the trenches and the first insulation layer acting as an etch stop; and
forming a second insulation layer on the thinned-back sealing layer after the etching, the etching accesses being sealed.

8. The method as recited in claim 6, further comprising the following steps:
forming a first insulation layer above a substrate;
forming the first micromechanical functional layer on the first insulation layer;
forming first etching accesses in the intermediate layer, which expose areas of the first micromechanical functional layer;
etching the first micromechanical functional layer through the etching accesses, the trenches and the first insulation layer acting as an etch stop; and
forming a second insulation layer on the intermediate layer after the etching, the etching accesses being sealed.

9. The method as recited in claim 7, further comprising the following steps:
forming the second micromechanical functional layer above the second insulation layer;
forming second etching accesses in the second micromechanical functional layer, which expose areas of the second insulation layer; and
selectively etching the first insulation layer and second insulation layer and thinned-back sealing layer in relation to the first and second micromechanical functional layer, the first insulation layer being removed except for remaining areas which anchor the first micromechanical functional layer on the substrate.

10. The method as recited in claim 8, further comprising the following steps:
forming the second micromechanical functional layer above the second insulation layer;
forming second etching accesses in the second micromechanical functional layer, which expose areas of the second insulation layer; and
selectively etching the first and second insulation layer, the thinned-back sealing layer, and the intermediate layer in relation to the first and second micromechanical functional layer, the first insulation layer being removed except for remaining areas which anchor the first micromechanical functional layer on the substrate.

11. The method as recited in claim 1, wherein the plurality of trenches include rounded edges and/or intersections including local constrictions.

12. The method as recited in claim 1, wherein the sealing layer includes one of more of the following layers: oxide layer, silicon nitride layer, silicon oxynitride layer, silicon layer, aluminum layer, germanium layer, titanium layer, tungsten layer, copper layer.

13. The method as recited in claim 6, wherein the intermediate layer includes one of more of the following layers: oxide layer, silicon nitride layer, silicon oxynitride layer, silicon layer, aluminum layer, germanium layer, titanium layer, tungsten layer, copper layer.

* * * * *